(12) United States Patent
Lee et al.

(10) Patent No.: US 11,239,148 B2
(45) Date of Patent: Feb. 1, 2022

(54) SEMICONDUCTOR PACKAGE

(71) Applicant: SAMSUNG ELECTRONICS CO., LTD., Suwon-si (KR)

(72) Inventors: Youngkwan Lee, Suwon-si (KR); Youngsik Hur, Suwon-si (KR); Taehee Han, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 75 days.

(21) Appl. No.: 16/684,808

(22) Filed: Nov. 15, 2019

(65) Prior Publication Data
US 2020/0185321 A1 Jun. 11, 2020

(30) Foreign Application Priority Data
Dec. 7, 2018 (KR) .................. 10-2018-0156736

(51) Int. Cl.
*H01L 23/498* (2006.01)
*H01L 23/31* (2006.01)
*H01L 23/00* (2006.01)
*H01L 23/552* (2006.01)

(52) U.S. Cl.
CPC .... *H01L 23/49866* (2013.01); *H01L 23/3157* (2013.01); *H01L 23/49811* (2013.01); *H01L 23/49827* (2013.01); *H01L 23/49861* (2013.01); *H01L 24/45* (2013.01); *H01L 23/552* (2013.01)

(58) Field of Classification Search
CPC ........... H01L 23/49866; H01L 23/3157; H01L 23/49861; H01L 23/49811; H01L 24/45; H01L 23/49827; H01L 23/552; H01L 2224/18; H01L 24/19; H01L 24/20; H01L 23/49816; H01L 23/5389; H01L 23/13; H01L 2221/68345; H01L 2221/68372; H01L 21/6835; H01L 23/3128; H01L 21/563; H01L 23/49579; H01L 23/49544
See application file for complete search history.

(56) References Cited

U.S. PATENT DOCUMENTS

| | | | | |
|---|---|---|---|---|
| 6,423,570 B1* | 7/2002 | Ma | .................. | H01L 21/561 |
| | | | | 257/612 |
| 6,586,276 B2* | 7/2003 | Towle | .................. | H01L 23/5389 |
| | | | | 257/E23.019 |
| 6,586,822 B1* | 7/2003 | Vu | .................. | H01L 23/532 |
| | | | | 257/678 |
| 6,709,898 B1* | 3/2004 | Ma | .................. | H01L 23/3128 |
| | | | | 257/675 |

(Continued)

FOREIGN PATENT DOCUMENTS

| KR | 10-1713037 B1 | 3/2017 |
|---|---|---|
| KR | 10-2018-0012187 A | 2/2018 |

*Primary Examiner* — Earl N Taylor
(74) *Attorney, Agent, or Firm* — Sughrue Mion, PLLC

(57) ABSTRACT

A semiconductor package includes a core layer formed of a ferromagnetic material, and includes a frame passing through the core layer and having a through-hole, a semiconductor chip disposed in the through-hole of the frame, and having an active surface on which a connection pad is disposed, and an inactive surface opposite to the active surface, an encapsulant covering at least a portion of the semiconductor chip, and a first connection structure including a first redistribution layer disposed on the active surface of the semiconductor chip and electrically connected to the connection pad.

16 Claims, 16 Drawing Sheets

(56) References Cited

U.S. PATENT DOCUMENTS

| | | | | |
|---|---|---|---|---|
| 6,713,859 B1* | 3/2004 | Ma | H01L 21/561 | 257/687 |
| 6,734,534 B1* | 5/2004 | Vu | H01L 21/561 | 257/668 |
| 6,894,399 B2* | 5/2005 | Vu | H01L 23/16 | 257/786 |
| 6,970,362 B1* | 11/2005 | Chakravorty | H01L 23/50 | 361/782 |
| 7,078,788 B2* | 7/2006 | Vu | H01L 21/56 | 174/521 |
| 7,183,658 B2* | 2/2007 | Towle | H01L 23/49838 | 257/784 |
| 9,853,003 B1* | 12/2017 | Han | H01L 23/3128 | |
| 9,941,245 B2* | 4/2018 | Skeete | H01L 25/16 | |
| 10,163,773 B1* | 12/2018 | Kapusta | H01L 24/92 | |
| 10,177,103 B1* | 1/2019 | Yi | H01L 24/24 | |
| 10,797,017 B2* | 10/2020 | Lin | H01L 24/24 | |
| 2002/0070443 A1* | 6/2002 | Mu | H01L 23/16 | 257/712 |
| 2002/0074641 A1* | 6/2002 | Towle | H01L 24/19 | 257/692 |
| 2002/0137263 A1* | 9/2002 | Towle | H01L 23/3128 | 438/127 |
| 2006/0138638 A1* | 6/2006 | Komatsu | H01L 23/49816 | 257/700 |
| 2006/0191711 A1* | 8/2006 | Cho | H01L 24/24 | 174/260 |
| 2007/0074900 A1* | 4/2007 | Lee | H01L 24/24 | 174/260 |
| 2007/0096292 A1* | 5/2007 | Machida | H01L 23/5389 | 257/700 |
| 2008/0041619 A1* | 2/2008 | Lee | H01L 24/24 | 174/260 |
| 2009/0001528 A1* | 1/2009 | Braunisch | H01L 23/647 | 257/659 |
| 2010/0006330 A1* | 1/2010 | Fu | H01L 23/49816 | 174/260 |
| 2011/0241218 A1* | 10/2011 | Meyer | H01L 21/568 | 257/774 |
| 2012/0228754 A1* | 9/2012 | Liu | A61P 3/00 | 257/676 |
| 2014/0070396 A1* | 3/2014 | Kyozuka | H01L 24/24 | 257/698 |
| 2014/0291859 A1* | 10/2014 | Kiwanami | H05K 1/185 | 257/774 |
| 2014/0293529 A1* | 10/2014 | Nair | H01Q 23/00 | 361/679.31 |
| 2015/0062848 A1* | 3/2015 | Lee | H05K 3/4697 | 361/761 |
| 2016/0027766 A1* | 1/2016 | Chung | H01L 24/20 | 438/107 |
| 2016/0081194 A1* | 3/2016 | Sato | H05K 3/4697 | 361/761 |
| 2016/0155559 A1* | 6/2016 | Chiu | H01L 23/645 | 336/200 |
| 2016/0338202 A1* | 11/2016 | Park | H01L 24/00 | |
| 2017/0040265 A1* | 2/2017 | Park | H01L 21/4853 | |
| 2017/0077047 A1* | 3/2017 | Lee | H01L 24/20 | |
| 2018/0138127 A1* | 5/2018 | Lee | H01L 23/16 | |
| 2019/0295984 A1* | 9/2019 | Lin | H01L 23/5389 | |
| 2020/0111748 A1* | 4/2020 | Leitgeb | H01L 21/4857 | |
| 2020/0185321 A1* | 6/2020 | Lee | H01L 23/5389 | |
| 2021/0084747 A1* | 3/2021 | Schrems | H05K 3/4697 | |

* cited by examiner

I-I'

SEMICONDUCTOR PACKAGE

CROSS-REFERENCE TO RELATED APPLICATION(S)

This application claims benefit of priority to Korean Patent Application No. 10-2018-0156736 filed on Dec. 7, 2018 in the Korean Intellectual Property Office, the disclosure of which is incorporated herein by reference in its entirety.

BACKGROUND

1. Field

The present disclosure relates to a semiconductor package, for example, to a fan-out semiconductor package.

2. Description of Related Art

Semiconductor packages are continuously pursuing lightness, thinness, shortness, and compactness in terms of design, while seeking to realize a System in Package (SiP) package requiring complexity and versatility in terms of functionality. One type of package technology suggested to satisfy the technical demand, described above, is a fan-out semiconductor package. Such a fan-out semiconductor package has a compact size and may allow a plurality of pins to be implemented by redistributing connection terminals outwardly of a region in which a semiconductor chip is disposed.

On the other hand, in such a package, materials, forming a semiconductor chip, a redistribution layer, and the like, are different from each other, and thus warpage due to a difference in coefficients of thermal expansion (CTE) may occur. Thus, when a plurality of packages are manufactured at a panel level having a large size, it may be difficult to transfer a panel due to warpage, and there may be a problem in a reduction in process accuracy.

SUMMARY

An aspect of the present disclosure is to provide a semiconductor package able to be easily manufactured, since the semiconductor package is able to be physically fixed to a magnetic plate.

According to an aspect of the present disclosure, in a semiconductor package, a core layer of a frame is formed of a ferromagnetic material.

The semiconductor package includes a core layer formed of a ferromagnetic material, and includes a frame passing through the core layer and having a through-hole, a semiconductor chip disposed in the through-hole of the frame, and having an active surface on which a connection pad is disposed, and an inactive surface opposite to the active surface, an encapsulant covering at least a portion of the semiconductor chip, and a first connection structure including a first redistribution layer disposed on the active surface of the semiconductor chip and electrically connected to the connection pad.

Other features and aspects will be apparent from the following detailed description, the drawings, and the claims.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Figure 1:
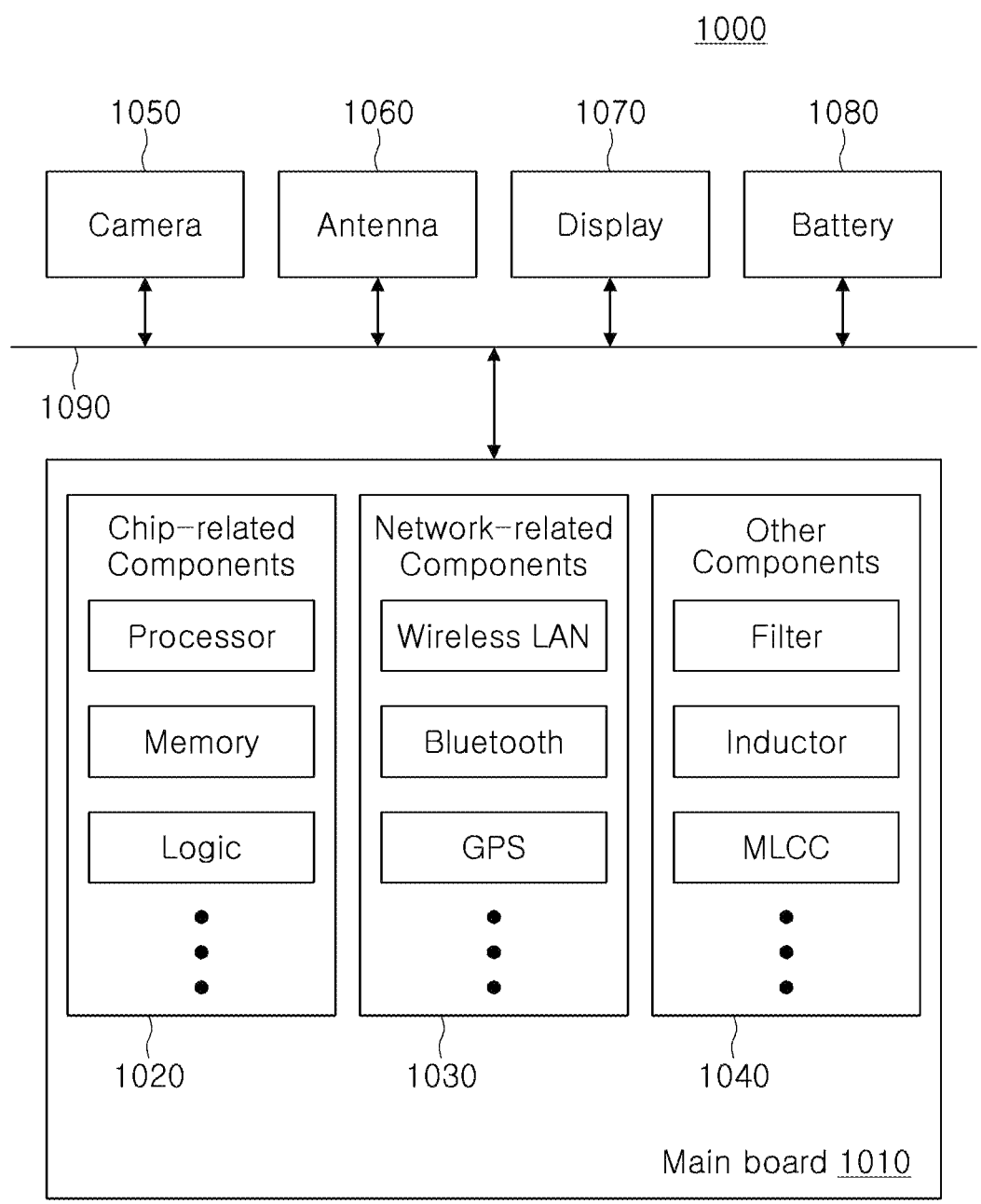
FIG. 1 is a schematic block diagram illustrating an example of an electronic device system.

Hereinafter, embodiments of the present disclosure will be described as follows with reference to the attached drawings.

The present disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

Throughout the specification, it will be understood that when an element, such as a layer, region or wafer (substrate), is referred to as being "on," "connected to," or "coupled to" another element, it can be directly "on," "connected to," or "coupled to" the other element or other elements intervening therebetween may be present. In contrast, when an element is referred to as being "directly on," "directly connected to," or "directly coupled to" another element, there may be no elements or layers intervening therebetween. Like numerals refer to like elements throughout. As used herein, the term "and/or" includes any and all combinations of one or more of the associated listed items.

It will be apparent that though the terms first, second, third, etc. may be used herein to describe various members, components, regions, layers and/or sections, these members, components, regions, layers and/or sections should not be limited by these terms. These terms are only used to distinguish one member, component, region, layer or section from another region, layer or section. Thus, a first member, component, region, layer or section discussed below could be termed a second member, component, region, layer or section without departing from the teachings of the exemplary embodiments.

Spatially relative terms, such as "above," "upper," "below," and "lower" and the like, may be used herein for ease of description to describe one element's relationship to another element(s) as shown in the figures. It will be understood that the spatially relative terms are intended to encompass different orientations of the device in use or operation in addition to the orientation depicted in the figures. For example, if the device in the figures is turned over, elements described as "above," or "upper" other elements would then be oriented "below," or "lower" the other elements or features. Thus, the term "above" can encompass both the above and below orientations depending on a particular direction of the figures. The device may be otherwise oriented (rotated 90 degrees or at other orientations) and the spatially relative descriptors used herein may be interpreted accordingly.

The terminology used herein describes particular embodiments only, and the present disclosure is not limited thereby. As used herein, the singular forms "a," "an," and "the" are intended to include the plural forms as well, unless the context clearly indicates otherwise. It will be further understood that the terms "comprises," and/or "comprising" when used in this specification, specify the presence of stated features, integers, steps, operations, members, elements, and/or groups thereof, but do not preclude the presence or addition of one or more other features, integers, steps, operations, members, elements, and/or groups thereof.

Hereinafter, embodiments of the present disclosure will be described with reference to schematic views illustrating embodiments of the present disclosure. In the drawings, for example, due to manufacturing techniques and/or tolerances, modifications of the shape shown may be estimated. Thus, embodiments of the present disclosure should not be construed as being limited to the particular shapes of regions shown herein, for example, to include a change in shape results in manufacturing. The following embodiments may also be constituted by one or a combination thereof.

The contents of the present disclosure described below may have a variety of configurations and propose only a required configuration herein, but are not limited thereto.

Electronic Device

FIG. 1 is a schematic block diagram illustrating an example of an electronic device system.

Referring to FIG. 1, an electronic device 1000 may accommodate a mainboard 1010 therein. The mother board 1010 may include chip related components 1020, network related components 1030, other components 1040, or the like, physically or electrically connected thereto. These components may be connected to others to be described below to form various signal lines 1090.

The chip associated components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital converter, an application-specific integrated circuit (ASIC), or the like, or the like. However, the chip associated components 1020 are not limited thereto, and may include other types of chip associated components. In addition, the chip-associated components 1020 may be combined with each other.

The network associated components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+(HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth®, 3G, 4G, and 5G protocols, and any other wireless and wired protocols, designated after the abovementioned protocols. However, the network associated components 1030 are not limited thereto, but may also include a variety of other wireless or wired standards or protocols. In addition, the network associated components 1030 may be combined with each other, together with the chip associated components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 or the network related components 1030 described above.

Depending on a type of the electronic device 1000, the electronic device 1000 includes other components that may or may not be physically or electrically connected to the mainboard 1010. These other components may include, for example, a camera 1050, an antenna 1060, a display 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, and may be any other electronic device able to process data.

Figure 2:
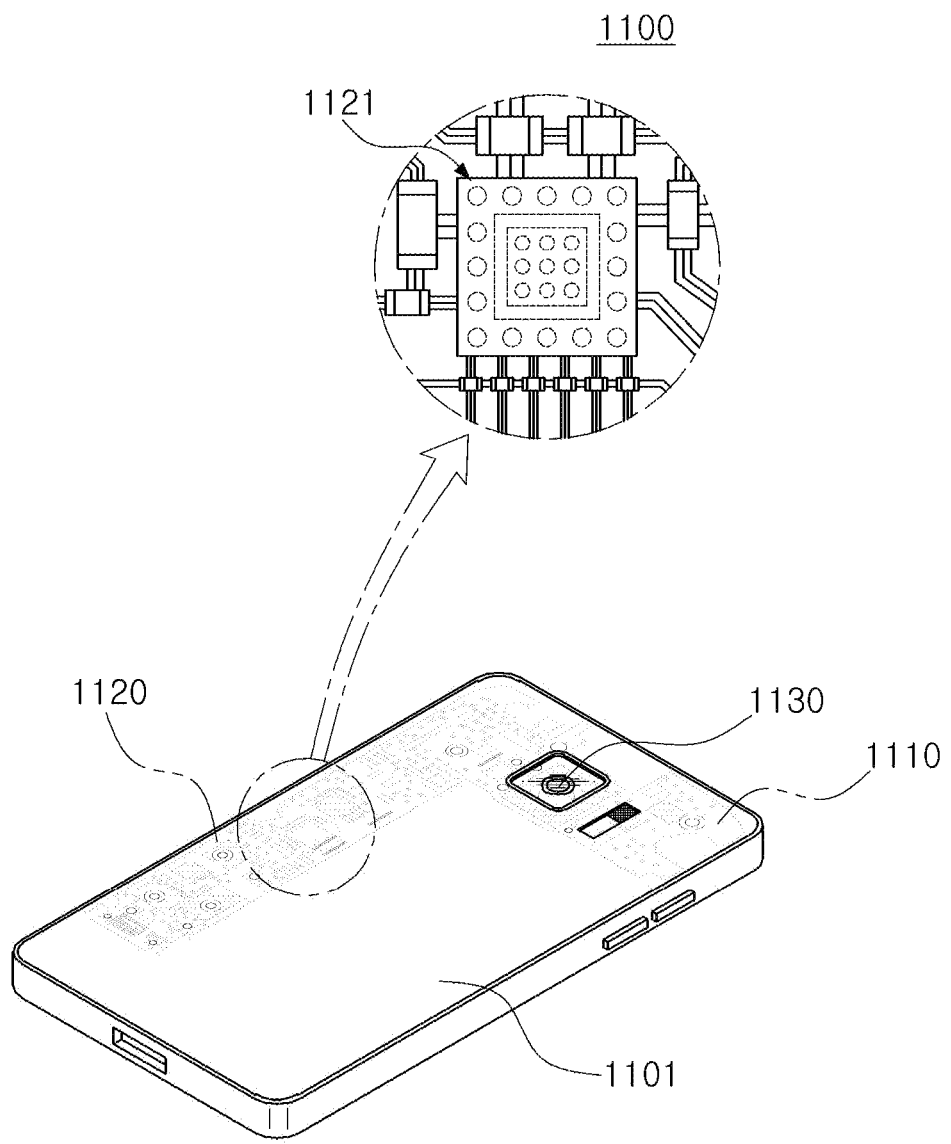
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a printed circuit board 1110 may be accommodated in a body 1101 of a smartphone 1100, and various electronic components 1120 may be physically or electrically connected to the printed circuit board 1110. In addition, other components that may or may not be physically or electrically connected to the printed circuit board 1110, such as a camera module 1130, may be accommodated in the body 1101. Some of the electronic components 1120 may be the chip related components, for example, a semiconductor package 1121, but are not limited thereto. The electronic device is not necessarily limited to the smartphone 1100, but may be other electronic devices as described above.

Semiconductor Package

Generally, numerous fine electrical circuits are integrated in a semiconductor chip. However, the semiconductor chip may not serve as a finished semiconductor product in itself, and may be damaged due to external physical or chemical impacts. Therefore, the semiconductor chip itself may not be used, but may be packaged and used in an electronic device, or the like, in a packaged state.

Here, semiconductor packaging is required due to the existence of a difference in a circuit width between the semiconductor chip and a mainboard of the electronic device in terms of electrical connections. In detail, a size of connection pads of the semiconductor chip and an interval between the connection pads of the semiconductor chip are very fine, but a size of component mounting pads of the mainboard used in the electronic device and an interval between the component mounting pads of the mainboard are significantly larger than those of the semiconductor chip. Therefore, it may be difficult to directly mount the semiconductor chip on the mainboard, and packaging technology for buffering a difference in a circuit width between the semiconductor chip and the mainboard is required.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Fan-In Semiconductor Package

Figure 3A:
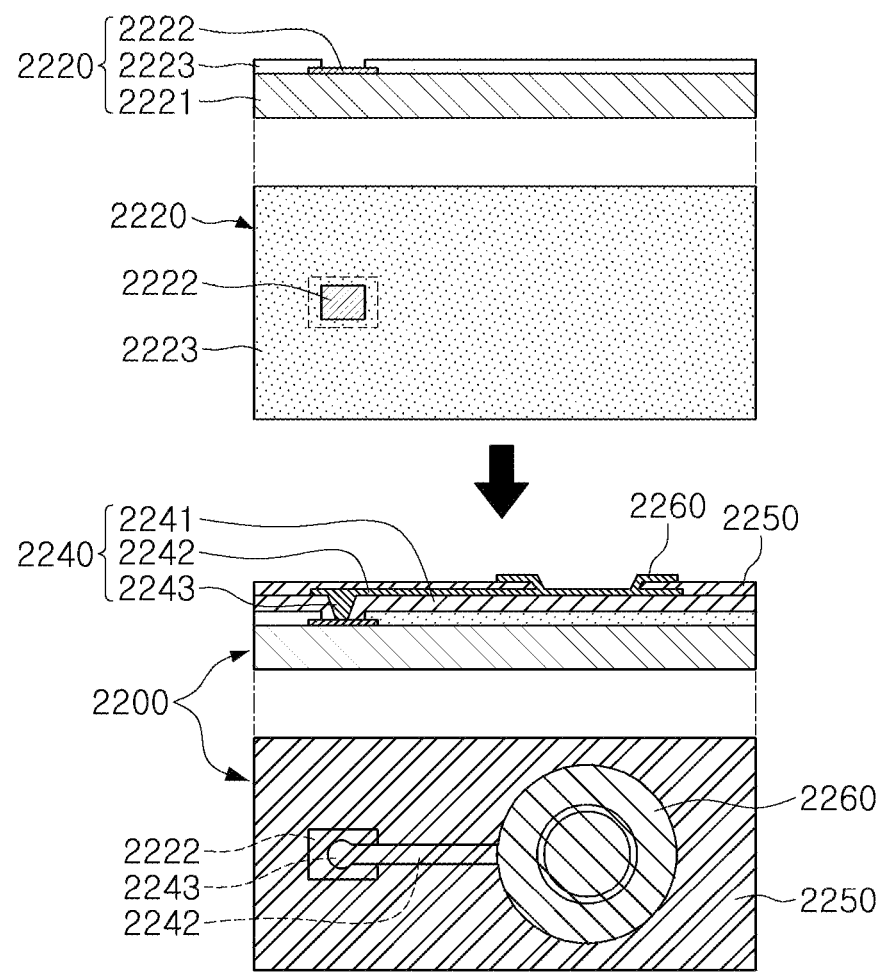
FIGS. 3A and 3B are schematic cross-sectional views illustrating states of a fan-in semiconductor package before and after being packaged.
Figure 3B:
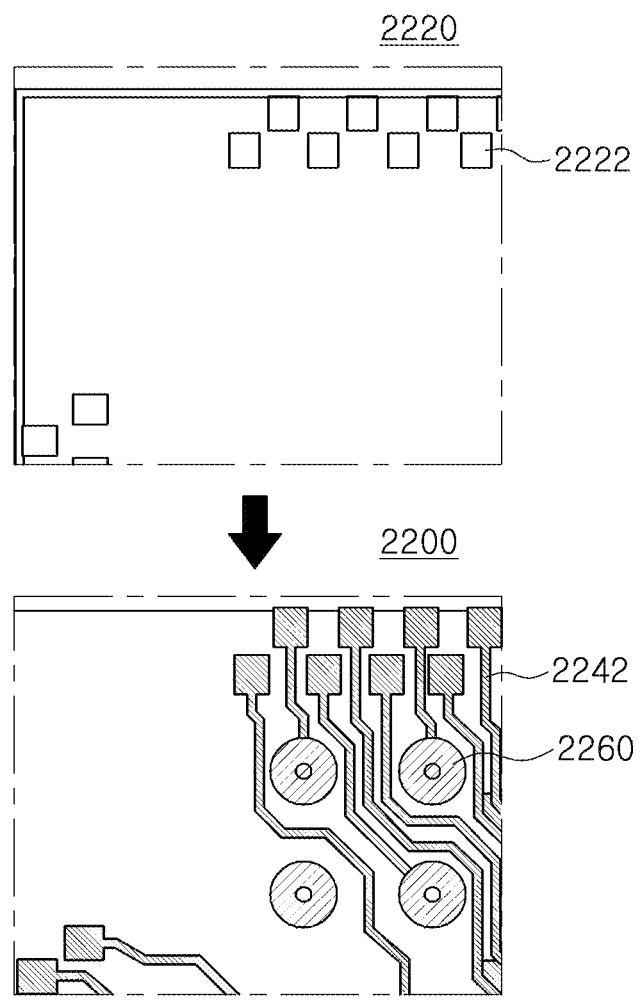

FIGS. 3A and 3B are schematic cross-sectional views illustrating states of a fan-in semiconductor package before and after being packaged.

Figure 4:
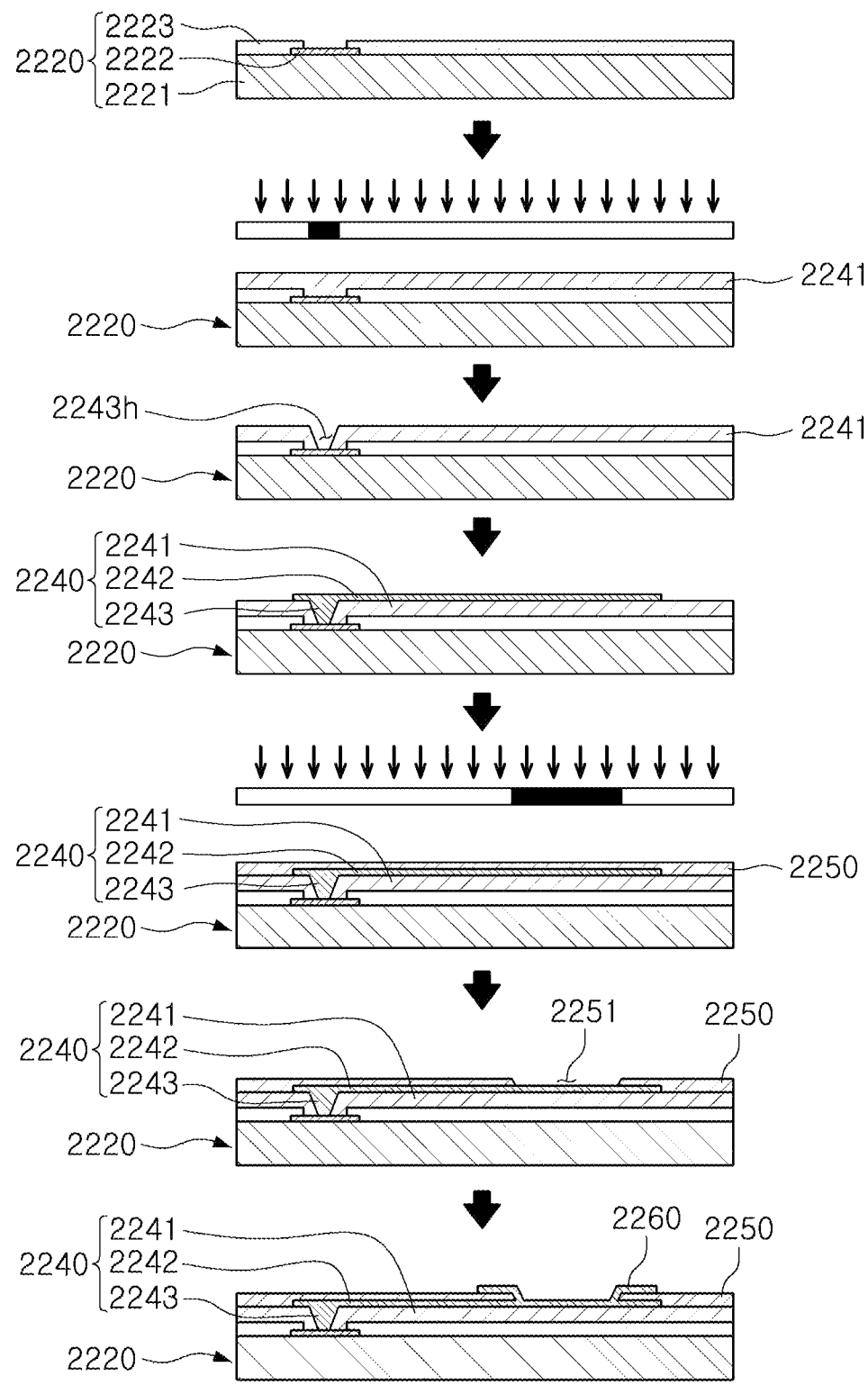
FIG. 4 is a schematic cross-sectional view illustrating a packaging process of a fan-in semiconductor package.

FIG. 4 is schematic cross-sectional views illustrating a packaging process of a fan-in semiconductor package.

Referring to FIGS. 3A, 3B, and 4, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide layer, a nitride layer, or the like, formed on one surface of the body 2221 and covering at least portions of the connection pads 2222. In this case, since the connection pads 2222 may be significantly small, it may be difficult to mount the integrated circuit (IC) on an intermediate level printed circuit board (PCB) as well as on the mainboard of the electronic device, or the like.

Therefore, a connection structure 2240 may be formed depending on a size of the semiconductor chip 2220 on the semiconductor chip 2220 in order to redistribute the connection pads 2222. The connection structure 2240 may be formed by forming an insulating layer 2241 on the semiconductor chip 2220 using an insulating material such as a photoimageable dielectric (PID) resin, forming via holes 2243h opening the connection pads 2222, and then forming wiring patterns 2242 and vias 2243. Then, a passivation layer 2250 protecting the connection structure 2240 may be formed, an opening 2251 may be formed, and an underbump metal layer 2260, or the like, may be formed. That is, a fan-in semiconductor package 2200 including, for example, the semiconductor chip 2220, the connection structure 2240, the passivation layer 2250, and the underbump metal layer 2260 may be manufactured through a series of processes.

As described above, the fan-in semiconductor package may have a package form in which all of the connection pads, for example, input/output (I/O) terminals, of the semiconductor chip are disposed inside the semiconductor chip, and may have excellent electrical characteristics and be produced at low cost. Therefore, many elements mounted in smartphones have been manufactured in a fan-in semiconductor package form. In detail, many elements mounted in smartphones have been developed to implement a rapid signal transfer while having a compact size.

However, since all I/O terminals need to be disposed inside the semiconductor chip in the fan-in semiconductor package, the fan-in semiconductor package has significant spatial limitations. Therefore, it is difficult to apply this structure to a semiconductor chip having a large number of I/O terminals or a semiconductor chip having a compact size. In addition, due to the disadvantage described above, the fan-in semiconductor package may not be directly mounted and used on the mainboard of the electronic device. Here, even in a case in which a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip may not be sufficient to directly mount the fan-in semiconductor package on the mainboard of the electronic device.

Figure 5:
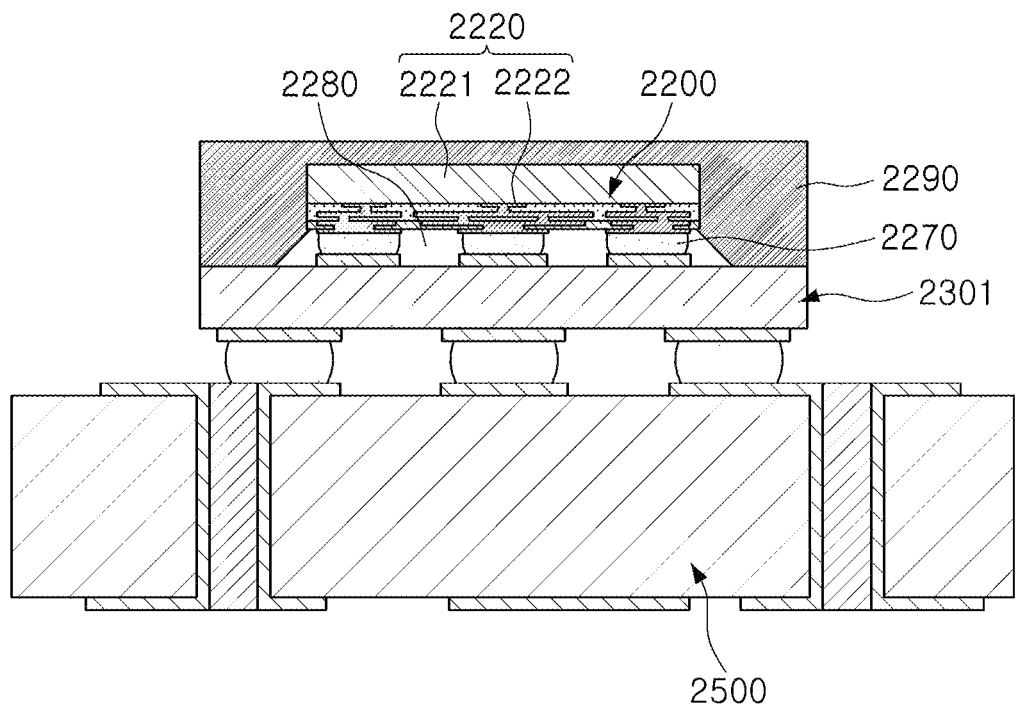
FIG. 5 is a schematic cross-sectional view illustrating a case in which a fan-in semiconductor package is mounted on an interposer substrate and is ultimately mounted on a mainboard of an electronic device.

FIG. 5 is a schematic cross-sectional view illustrating a case in which a fan-in semiconductor package is mounted on an interposer substrate and is ultimately mounted on a mainboard of an electronic device.

Figure 6:
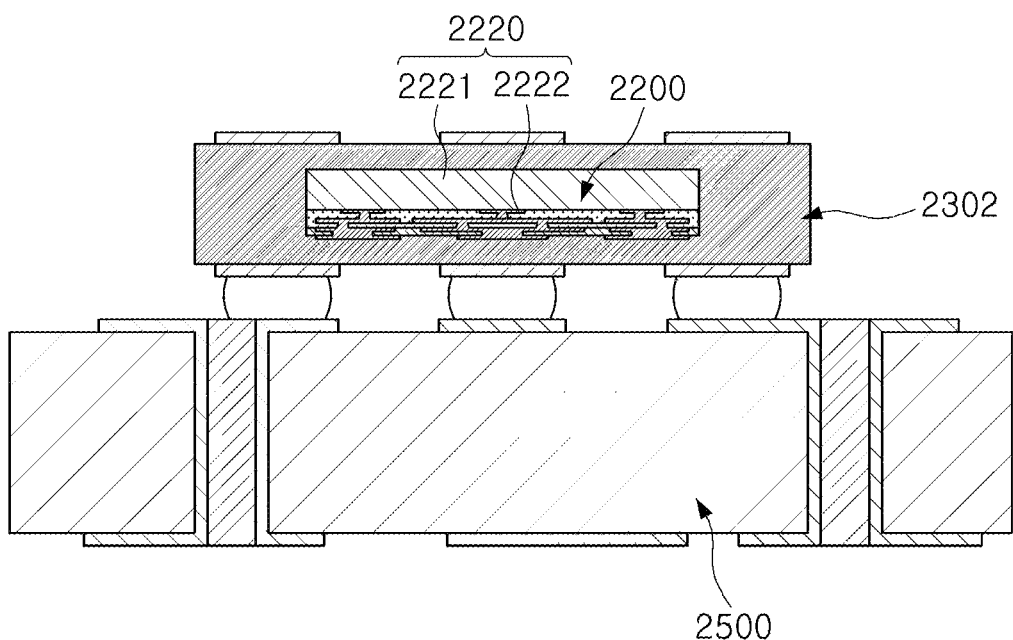
FIG. 6 is a schematic cross-sectional view illustrating a case in which a fan-in semiconductor package is embedded in an interposer substrate and is ultimately mounted on a mainboard of an electronic device.

FIG. 6 is a schematic cross-sectional view illustrating a case in which a fan-in semiconductor package is embedded in an interposer substrate and is ultimately mounted on a mainboard of an electronic device.

Referring to FIGS. 5 and 6, in a fan-in semiconductor package 2200, connection pads 2222, that is, I/O terminals, of a semiconductor chip 2220 may be redistributed through an interposer substrate 2301, and the fan-in semiconductor package 2200 may ultimately be mounted on a mainboard 2500 of an electronic device in a state in which it is mounted on the interposer substrate 2301. In this case, solder balls 2270, and the like, may be fixed by an underfill resin 2280, or the like, and an outer side of the semiconductor chip 2220 may be covered with a molding material 2290, or the like. Alternatively, a fan-in semiconductor package 2200 may be embedded in a separate interposer substrate 2302, connection pads 2222, that is, I/O terminals, of the semiconductor chip 2220 may be redistributed by the interposer substrate 2302 in a state in which the fan-in semiconductor package 2200 is embedded in the interposer substrate 2302, and the fan-in semiconductor package 2200 may be ultimately mounted on a mainboard 2500 of an electronic device.

As described above, it may be difficult to directly mount and use the fan-in semiconductor package on the mainboard of the electronic device. Therefore, the fan-in semiconductor package may be mounted on the separate interposer substrate and be then mounted on the mainboard of the electronic device through a packaging process or may be mounted and used on the mainboard of the electronic device in a state in which it is embedded in the interposer substrate.
Fan-Out Semiconductor Package FIG. 7 is a schematic cross-sectional view illustrating a fan-out semiconductor package.

Figure 7:
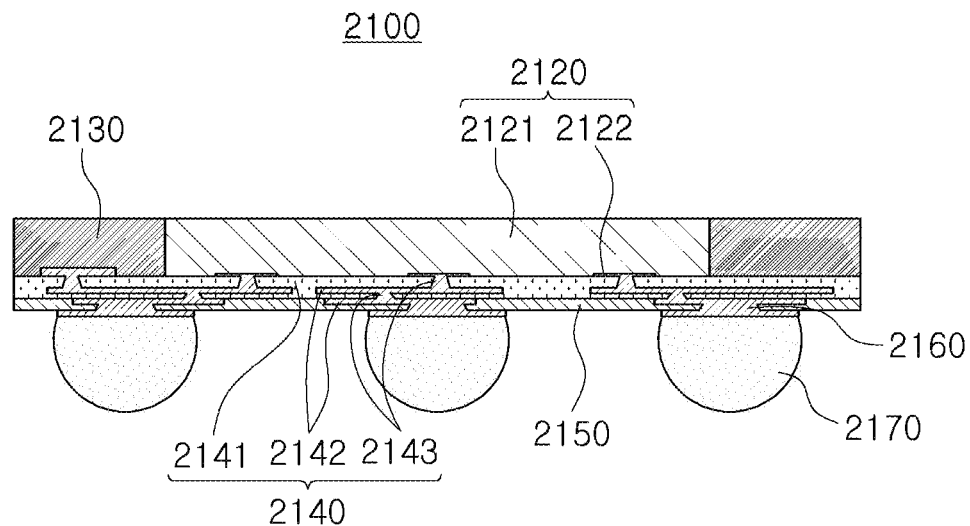
FIG. 7 is a schematic cross-sectional view illustrating a fan-out semiconductor package.

Referring to FIG. 7, in a fan-out semiconductor package 2100, for example, an outer side of a semiconductor chip 2120 may be protected by an encapsulant 2130, and connection pads 2122 of the semiconductor chip 2120 may be redistributed outwardly of the semiconductor chip 2120 by a connection structure 2140. In this case, a passivation layer 2150 may further be formed on the connection structure 2140, and an underbump metal layer 2160 may further be formed in openings of the passivation layer 2150. Solder balls 2170 may further be formed on the underbump metal layer 2160. The semiconductor chip 2120 may be an integrated circuit (IC) including a body 2121, connection pads 2122, a passivation layer (not illustrated), and the like. The connection structure 2140 may include an insulating layer 2141, redistribution layers 2142 formed on the insulating layer 2141, and vias 2143 electrically connecting the connection pads 2122 and the redistribution layers 2142 to each other.

As described above, the fan-out semiconductor package may have a form in which I/O terminals of the semiconductor chip are redistributed and disposed outwardly of the semiconductor chip through the connection structure formed on the semiconductor chip. As described above, in the fan-in semiconductor package, all I/O terminals of the semiconductor chip need to be disposed inside the semiconductor chip. Therefore, when the size of the semiconductor chip is decreased, the size and the pitch of balls need to be decreased, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the connection structure formed on the semiconductor chip as described above. Therefore, even in the case that a size of the semiconductor chip is decreased, the standardized ball layout may be used in the fan-out semiconductor package as is, such that the fan-out semiconductor package may be mounted on the mainboard of the electronic device without using a separate printed circuit board, as described below.

Figure 8:
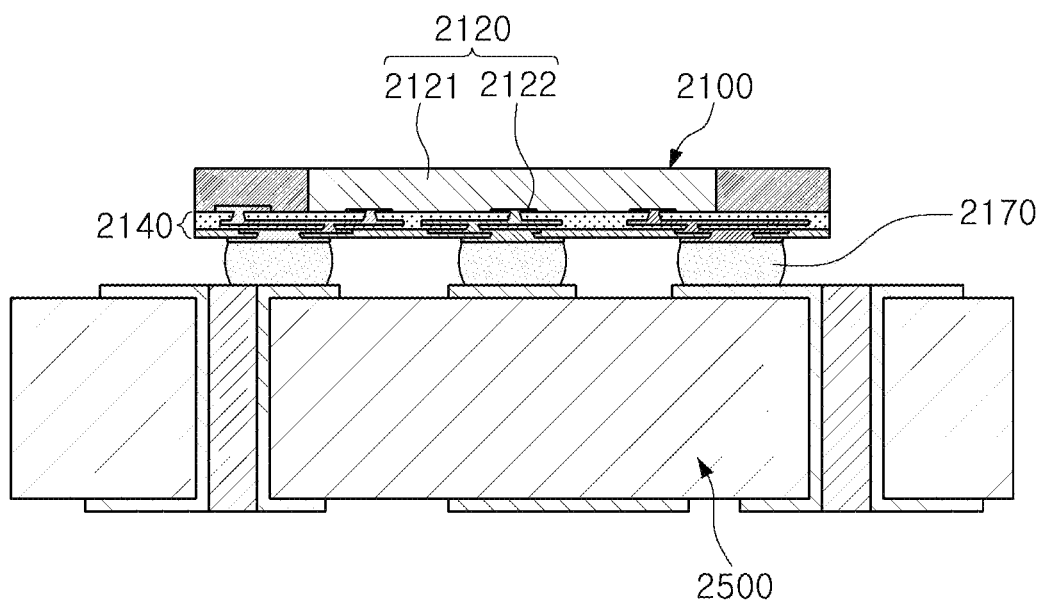
FIG. 8 is a schematic cross-sectional view illustrating a case in which a fan-out semiconductor package is mounted on a mainboard of an electronic device.

FIG. 8 is a schematic cross-sectional view illustrating a case in which a fan-out semiconductor package is mounted on a mainboard of an electronic device.

Referring to FIG. 8, a fan-out semiconductor package 2100 may be mounted on a mainboard 2500 of an electronic device through solder balls 2170, or the like. That is, as described above, the fan-out semiconductor package 2100 includes the connection structure 2140 formed on the semiconductor chip 2120 and is capable of redistributing the connection pads 2122 to a fan-out region that is outside of the area of the semiconductor chip 2120, such that the standardized ball layout may be used in the fan-out semiconductor package 2100 as is. As a result, the fan-out semiconductor package 2100 may be mounted on the mainboard 2500 of the electronic device without using a separate interposer substrate, or the like.

As described above, since the fan-out semiconductor package may be mounted on the mainboard of the electronic device without using the separate interposer substrate, the fan-out semiconductor package may be implemented at a thickness lower than that of the fan-in semiconductor package using the interposer substrate. Therefore, the fan-out semiconductor package may be miniaturized and thinned. In addition, the fan-out semiconductor package has excellent thermal characteristics and electrical characteristics, such that it is particularly appropriate for a mobile product. Therefore, the fan-out electronic component package may be implemented in a form more compact than that of a general package-on-package (POP) type using a printed circuit board (PCB), and may solve a problem due to the occurrence of a warpage phenomenon.

Meanwhile, the fan-out semiconductor package refers to package technology for mounting the semiconductor chip on the mainboard of the electronic device, or the like, as described above, and protecting the semiconductor chip from external impacts, and is a concept different from that of a printed circuit board (PCB) such as an interposer substrate, or the like, having a scale, a purpose, and the like, different from those of the fan-out semiconductor package, and having the fan-in semiconductor package embedded therein.

Figure 9:
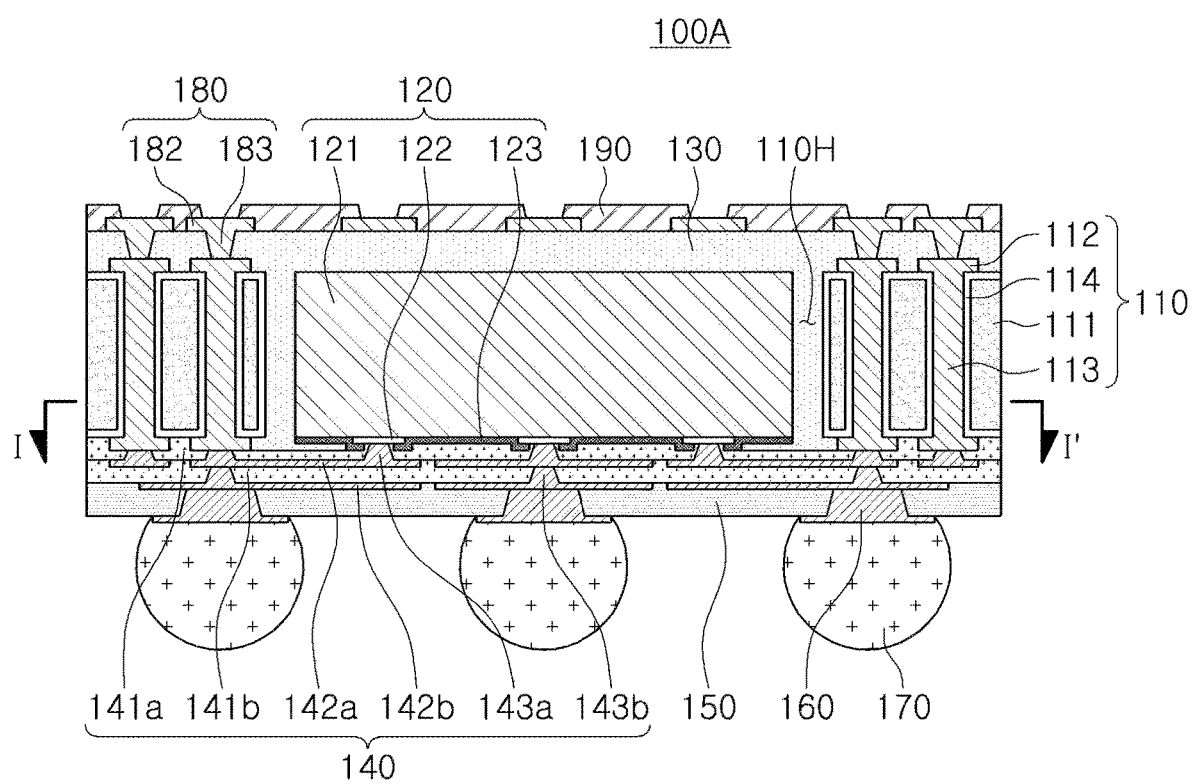
FIG. 9 is a schematic cross-sectional view illustrating an example of a semiconductor package.

FIG. 9 is a schematic cross-sectional view illustrating an example of a semiconductor package.

Figure 10:
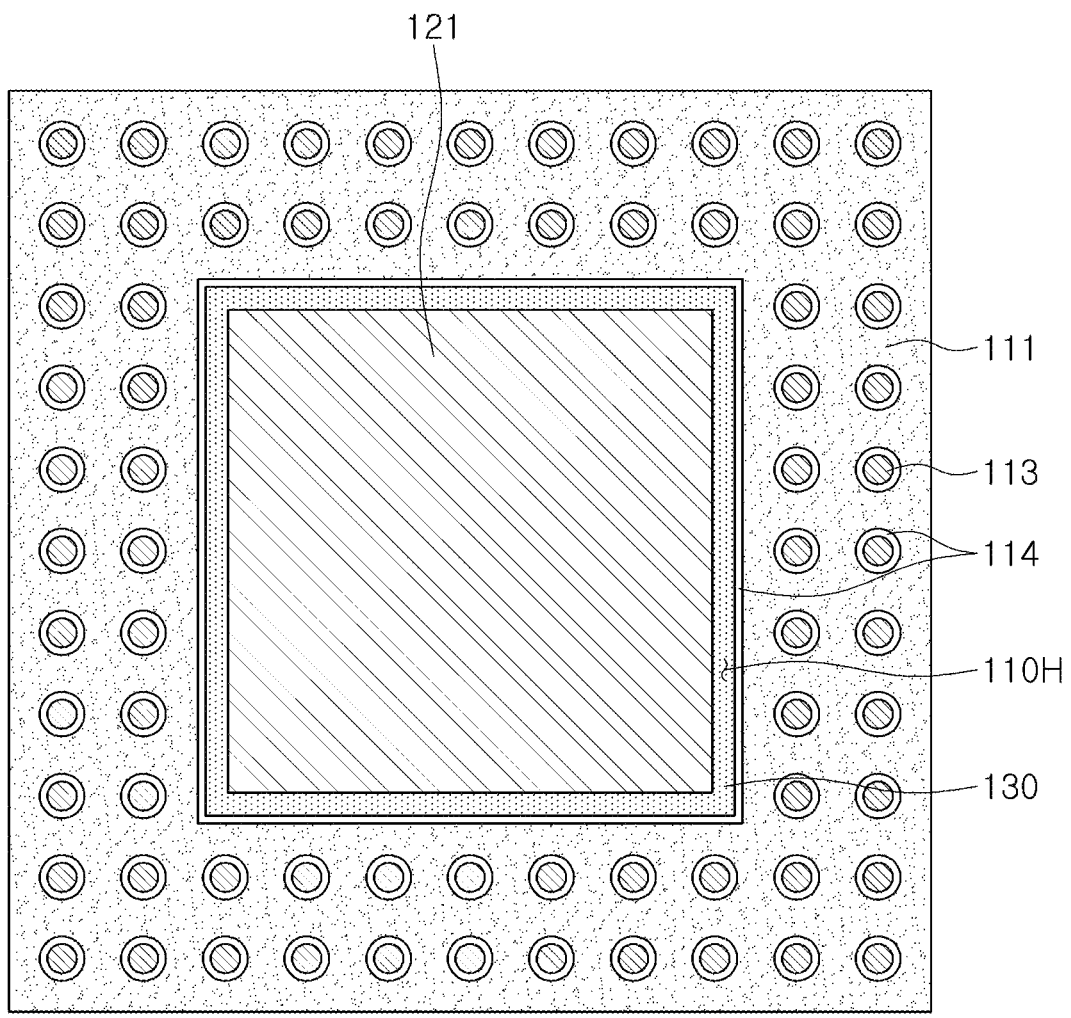
FIG. 10 is a schematic plan view taken along line I-I' of the semiconductor package of FIG. 9.

FIG. 10 is a schematic plan view taken along line I-I' of the semiconductor package of FIG. 9.

Referring to FIGS. 9 and 10, a semiconductor package 100A according to an embodiment may include a frame 110 including a core layer 111 formed of a ferromagnetic material, and having a through-hole 110H passing through the core layer 111, a semiconductor chip 120 disposed in the through-hole 110H of the frame 110, and having an active surface on which the connection pad 122 is disposed, and an inactive surface opposite to the active surface, an encapsulant 130 sealing at least portions of the frame 110 and the semiconductor chip 120, a first connection structure 140 disposed on a lower surface of the frame 10 and the active surface of the semiconductor chip 120, and including redistribution layers 142a and 142b electrically connected to the connection pad 122, a second connection structure 180 disposed on the encapsulant 130, a first passivation layer 150 disposed on the first connection structure 140, an underbump metal layer 160 disposed in an opening of the first passivation layer 150, an electrical connection metal 170 disposed on the first passivation layer 150 and connected to the underbump metal layer 160, and a second passivation layer 190 disposed on the second connection structure 180.

The frame 110 includes a core layer 111 formed of a ferromagnetic material, a wiring layer 112 disposed on an upper surface and a lower surface of the core layer 111, a connection via 113 passing through the core layer 111 and connected to the wiring layer 112, and a core insulating layer 114 covering most of a surface of the core layer 111. The frame 110 may have magnetic properties due to the core layer 111. Accordingly, during a manufacturing process, the frame may be attached to a magnetic plate, or the like, by magnetic force. The core layer 111 may be formed of a ferromagnetic material, and may thus have ferromagnetic properties. In the core layer 111, a ferromagnetic material is uniformly distributed therein. The core layer 111 may be formed of a conductive ferromagnetic metal, and may include, for example, at least one selected from the group consisting of iron (Fe), nickel (Ni), cobalt (Co), and alloys thereof. The ferromagnetic material may be the conductive ferromagnetic metal. In detail, the core layer 111 may be a layer provided by processing a cold rolled steel sheet. The core layer 111 may be disposed to surround the through-hole 110H and the semiconductor chip 120, and may be evenly arranged over an entire area of the frame 110 without being shifted to any one area within the frame 110. The core insulating layer 114 is disposed to cover most of a surface of the core layer 111, that is, a side surface except for the outmost side surface forming a side surface of the package 110A, an upper surface, and a lower surface. When the core layer 111 is conductive, the core layer 111 may be electrically isolated from the first connection structure 140 and the second connection structure 180, and the wiring layer 112, due to the core insulating layer 114.

When the semiconductor package includes a frame, the core layer, forming a body portion of the frame, is often formed of an organic material including resin and glass fiber. In this case, the core layer itself may have excellent bending properties. However, coefficients of thermal expansion of an upper portion and a lower portion of the core layer is asymmetrical due to a through-hole, a redistribution layer on a lower surface, and the like. Thus, warpage may occur in the package. Due to the occurrence of such warpage, it may be difficult to transfer packages in a panel level during a manufacturing process. Moreover, it may be difficult to form a microcircuit, such as a redistribution layer by performing a stacking process on a frame.

On the other hand, in the case of the semiconductor package 100A according to an embodiment, as described above, the core layer 111 of the frame 110 is formed of a ferromagnetic material, so the frame 110 has magnetic properties. Thus, a panel is able to move using a magnetic force during a manufacturing process, and the panel is physically fixed to a magnetic plate, so flatness may be maintained to a certain level. Thus, a defect caused by warpage during a process may be prevented from occurring.

The respective components included in the semiconductor package 100A according to the exemplary embodiment will hereinafter be described in more detail.

The frame 110 may improve rigidity of the semiconductor package 100A depending on certain materials, and serve to secure uniformity of a thickness of the encapsulant 130. The frame 110 may have a through-hole 110H, passing through at least the core layer 111. In the through-hole 110H, the semiconductor chip 120 is disposed, and a passive component may be disposed together as required. As illustrated in FIG. 10, the through-hole 110H may have a wall surface surrounding the semiconductor chip 120, but is not limited thereto. The frame 110 may further include a wiring layer 112 and a connection via 113, in addition to the core layer 111 and the core insulating layer 114, to function as an electrical connecting member.

The wiring layers 112 may provide an upper/lower electrical connection path of a package with the connection via 113, and may serve to redistribute the connection pad 122. The wiring layers 112 are disposed on an upper surface and a lower surface of the core layer 111, and may be electrically isolated from the core layer 111 by the core insulating layer 114. A material for formation of the wiring layer 112 may also be a metal material such as copper (Cu), aluminum (Al), silver (Ag), tin (Sn), gold (Au), nickel (Ni), lead (Pb), titanium (Ti), or alloys thereof. The wiring layer 112 may perform various functions depending on a design of a corresponding layer. For example, the wiring layers may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the redistribution layer may include via pads, electrical connection metal pads, and the like. The wiring layers 112 may be formed using a known plating process, and each may be formed of a seed layer and a conductor layer.

The connection via 113 passes through an upper surface and a lower surface of the core layer 111, and may be electrically isolated from the core layer 111 by the core insulating layer 114. The connection via 113 may electrically connect the wiring layers 112, formed on upper and lower surfaces of the core layer 111, to each other, resulting in an electrical path in the frame 110. A material for formation of the connection via 113 may also be a metal material such as copper (Cu), aluminum (Al), silver (Ag), tin (Sn), gold (Au), nickel (Ni), lead (Pb), titanium (Ti), or alloys thereof. The connection via 113 may be a via in a filled type, filled with a metal material, or may be a via in a conformal type, in which a metal material is formed along a wall surface of a via hole. Each of the connection vias 113 may have a cylindrical shape having a substantially constant width. Moreover, each of the connection vias may have a tapered shape. The connection via 113 may be formed using a plating process, and may be formed of a seed layer and a conductor layer.

As illustrated in FIG. 10, the core insulating layer 114 may be disposed on a side wall of the through-hole 110H, a side wall of the connection via 113, and an upper surface and a lower surface of the core layer 111. A material of the core insulating layer 114 is not particularly limited. For example, an insulating material may be used as the material of the core insulating layer. In this case, the insulating material may be a thermosetting resin such as an epoxy resin, a thermoplastic resin such as a polyimid resin, or a resin in which the thermosetting resin or the thermoplastic resin is mixed with an inorganic filler, for example, an Ajinomoto build-up film (ABF), or the like. Alternatively, the insulating material may be a material in which the thermosetting resin or the thermoplastic resin is impregnated together with an inorganic filler in a core material such as a glass fiber (or a glass cloth or a glass fabric), for example, a prepreg.

The semiconductor chip 120 may be an integrated circuit (IC) provided in an amount of several hundred to several million or more elements integrated in a single chip. The IC may be, for example, a processor chip such as a central processor (for example, a central processing unit (CPU)), a graphics processor (for example, a graphics processing unit (GPU)), a field programmable gate array (FPGA), a digital signal processor, a cryptographic processor, a microprocessor, a microcontroller, or the like, in detail, an application processor (AP). However, the present disclosure is not limited thereto, and the semiconductor chip may be a logic chip such as an analog-to-digital converter (ADC), an application-specific integrated circuit (ASIC), or the like, or a memory chip such as a volatile memory (for example, a dynamic random access memory (DRAM)), a non-volatile memory (for example, a read only memory (ROM)), a flash memory, or the like, but is not limited thereto Moreover, these chip related components are also combined.

In the semiconductor chip 120, a side, on which connection pad 122 is disposed, is an active surface, and the opposite side is an inactive surface. The semiconductor chip 120 may be formed on the basis of an active wafer. In this case, a base material of a body 121 of the semiconductor chip 120 may be silicon (Si), germanium (Ge), gallium arsenide (GaAs), or the like. Various circuits may be formed on the body 121. The connection pads 122 may electrically connect the semiconductor chip 120 to other components. A material of each of the connection pads 122 may be a conductive material such as aluminum (Al), or the like. A passivation layer 123 exposing the connection pads 122 may be formed on the body 121, and may be an oxide layer, a nitride layer, or the like, or a double layer of an oxide layer and a nitride layer.

The encapsulant 130 may fill at least a portion of the through-hole 110H, while sealing the semiconductor chip 120. An encapsulation form of the first encapsulant 131 is not particularly limited, but may be a form in which the first encapsulant 131 surrounds at least a portion of the semiconductor chip 120. In this case, the encapsulant 130 may cover at least portions of the frame 110 and an inactive surface of the semiconductor chip 120, and fill at least a portion of a space between a wall surface of the through-hole 110H and a side surface of the semiconductor chip 120. Meanwhile, the encapsulant 130 may fill the through-hole 110H to thus serve as an adhesive for fixing the semiconductor chip 120 and reduce buckling depending on certain materials. The encapsulant 130 may include an insulating material. The insulating material may be a material containing an inorganic filler and an insulating resin, for example, a thermosetting resin such as an epoxy resin, a thermoplastic resin such as a polyimid, or a resin in which a reinforcement such as an inorganic filler is contained in the thermosetting resin or the thermoplastic resin, in detail, an Ajinomoto build-up film (ABF), an FR-4 resin, a bismaleimide triazine (BT) resin, a resin, or the like. Moreover, a molding material such as an epoxy molding compound (EMC) may be used, or a photosensitive material, that is, a photo imageable encapsulant (PIE) may be used, as needed. As needed, a material in which an insulating resin such as the thermosetting resin or the thermoplastic resin is impregnated in a core material such as an inorganic filler and/or a glass fiber (or a glass cloth or a glass fabric), may be used.

The first connection structure 140 may redistribute the connection pads 122 of the semiconductor chip 120. Several tens to several hundreds of connection pads 122 of the semiconductor chip 120 having various functions may be redistributed by the first connection structure 140, and may be physically or electrically externally connected through the electrical connection metal 170 depending on functions. The first connection structure 140 may include a first insulating layer 141a disposed on the frame 110 and the active surface of the semiconductor chip 120, a first redistribution layer 142a disposed on the first insulating layer 141a, a first via 143a passing through the first insulating layer 141a and electrically connecting the connection pad 122 to the first redistribution layer 142a, a second insulating layer 141b disposed on the first insulating layer 141a, a second redistribution layer 142b disposed on the second insulating layer 141b, and a second via 143b connecting the first and second redistribution layers 142a and 142b while passing through the second insulating layer 141b. The first connection structure 140 may include the number of insulating layers, redistribution layers, and vias, greater than illustrated in the drawings.

A material of the first and second insulating layers 141a and 141b may be an insulating material. In this case, the insulating material may be a photosensitive insulating material (PID). In this case, a fine pitch may be introduced through a photovia, so it is advantageous in microcircuits and high density design, and tens to millions of connection pads 122 of the semiconductor chip 120 may be effectively redistributed. A boundary between the first and second insulating layers 141a and 141b may be clear, or the boundary therebetween may not be readily apparent.

The first and second redistribution layers 142a and 142b may redistribute the connection pad 122 of the semiconductor chip 120 to be electrically connected to the electrical connection metal 170. A material of each of the first and second redistribution layers 142a and 142b may be a conductive material such as copper (Cu), aluminum (Al), silver (Ag), tin (Sn), gold (Au), nickel (Ni), lead (Pb), titanium (Ti), or alloys thereof. The first and second redistribution layers 142a and 142b may perform various functions depending on designs of corresponding layers. For example, the redistribution layers may include ground (GND) pattern layers 142G, and may include power (PWR) patterns, signal (S) patterns, and the like. Here, the signal (S) patterns may include various signals except for the ground (GND) signals, the power (PWR) signals, and the like, such as data signals, and the like. Moreover, the first and second redistribution layers 142a and 142b may include via pad patterns, electrical connection metal pad patterns, and the like.

The first and second vias 143a and 143b electrically connect the first and second redistribution layers 142a and 142b, formed in different layers, to each other, and electrically connect the connection pad 122 of the semiconductor chip 120 to the first redistribution layer 142a. The first and second vias 143a and 143b may be in physical contact with the connection pad 122 when the semiconductor chip 120 is a bare die. A material of each of the first and second vias 143a and 143b may be a conductive material such as copper (Cu), aluminum (Al), silver (Ag), tin (Sn), gold (Au), nickel (Ni), lead (Pb), titanium (Ti), or alloys thereof. Each of the first and second vias 143a and 143b may be completely filled with a conductive material, or the conductive material may be formed along a wall of a via. In addition, the first and second via 143a and 143b may have all shapes known in the related art, such as a tapered shape, a cylindrical shape, and the like.

On the encapsulant 130, a second connection structure 180, including a backside redistribution layer 182 and a backside via 183, may be disposed. The backside redistribution layer 182 is disposed on the encapsulant 130, and may be connected to the wiring layer 112 of the frame 110 by the backside via 183 passing through the encapsulant 130. The second connection structure 180 may be electrically connected to the connection pad 122 of the semiconductor chip 120 and/or the first connection structure 140. Moreover, the second connection structure 180 may electrically connect a semiconductor chip or a semiconductor package, mounted on an upper portion of a package, to the first connection structure 140 in a lower portion of the package. At least a portion of the backside redistribution layer 182 may be exposed upwardly through the second passivation layer 190 for connection with a configuration in an upper portion. According to an embodiment, the backside redistribution layer 182 has a plate shape in an upper portion of the semiconductor chip 120, and the backside via 183 may have a trench via or line via shape having a predetermined length. In this case, substantially all of movement paths of the electromagnetic waves are blocked, and thus the effect of shielding electromagnetic waves may be further excellent. The backside redistribution layer 182 and the backside via 183 may also include a conductive material such as copper (Cu), aluminum (Al), silver (Ag), tin (Sn), gold (Au), nickel (Ni), lead (Pb), titanium (Ti), or alloys thereof.

The first passivation layer 150 may protect the first connection structure 140 from external physical or chemical damage. The first passivation layer 150 may have an opening exposing at least a portion of the second redistribution layer 142b of the first connection structure 140. The number of openings, formed in the first passivation layer 150, may be several tens to several thousands. A material of the first passivation layer 150 is not particularly limited. For example, an insulating material may be used as the material of the first passivation layer. In this case, the insulating material may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass cloth or a glass fabric), for example, prepreg, ABF, FR-4, BT, or the like. Alternatively, a solder resist may also be used. A second passivation layer 190 is also formed on the second connection structure 180 to protect the second connection structure 180. The first passivation layer 150 and the second passivation layer 190 include the same material, thereby serving to control a coefficient of thermal expansion (CTE) due to an effect of symmetry.

The underbump metal layer 160 may improve connection reliability of the electrical connection metal 170 to improve board level reliability of the semiconductor package 100A. The underbump metal layer 160 may be connected to the second redistribution layer 142b of the first connection structure 140, exposed through the openings of the first passivation layer 150. The underbump metal layer 160 may be formed in the openings of the first passivation layer 150 by any known metallization method using any known conductive material such as a metal, but is not limited thereto.

The electrical connection metal 170 physically and/or electrically connects the semiconductor package 100A to an external power source. For example, the semiconductor package 100A may be mounted on the mainboard of the electronic device through the electrical connection metal 170. The electrical connection metal 170 may be formed of a conductive material, for example, a solder or the like. However, this is only an example, and a material of each of the electrical connection metal 170 is not particularly limited thereto. Each of the electrical connection metals 170 may be a land, a ball, a pin, or the like. The electrical connection metals 170 may be formed as a multilayer or single layer structure. When the electrical connection metal includes the plurality of layers, the electrical connection metal includes a copper pillar and a solder. When the electrical connection metal includes the single layer, the electrical connection metal includes a tin-silver solder or copper. However, the electrical connection metal is only an example, and the present disclosure is not limited thereto. The number, an interval, a disposition form, and the like, of electrical connection metal 170 are not particularly limited, but may be sufficiently modified depending on design particulars by those skilled in the art. For example, the electrical connection metals 170 may be provided in an amount of several tens to several thousands, or may be provided in an amount of several tens to several thousands or more or several tens to several thousands or less.

At least one of the electrical connection metals 170 may be disposed in a fan-out region of the semiconductor chip 120. The fan-out region refers to a region except for a region in which the semiconductor chip 120 is disposed. The fan-out package may have excellent reliability as compared to a fan-in package, may allow a plurality of input/output (I/O) terminals to be implemented, and may facilitate a 3D interconnection. In addition, as compared to a ball grid array (BGA) package, a land grid array (LGA) package, or the like, the fan-out package may be manufactured to have a small thickness, and may have price competitiveness.

FIGS. 11A to 11D are schematic process drawings illustrating a manufacturing example of the semiconductor package of FIG. 9.

Figure 11A:
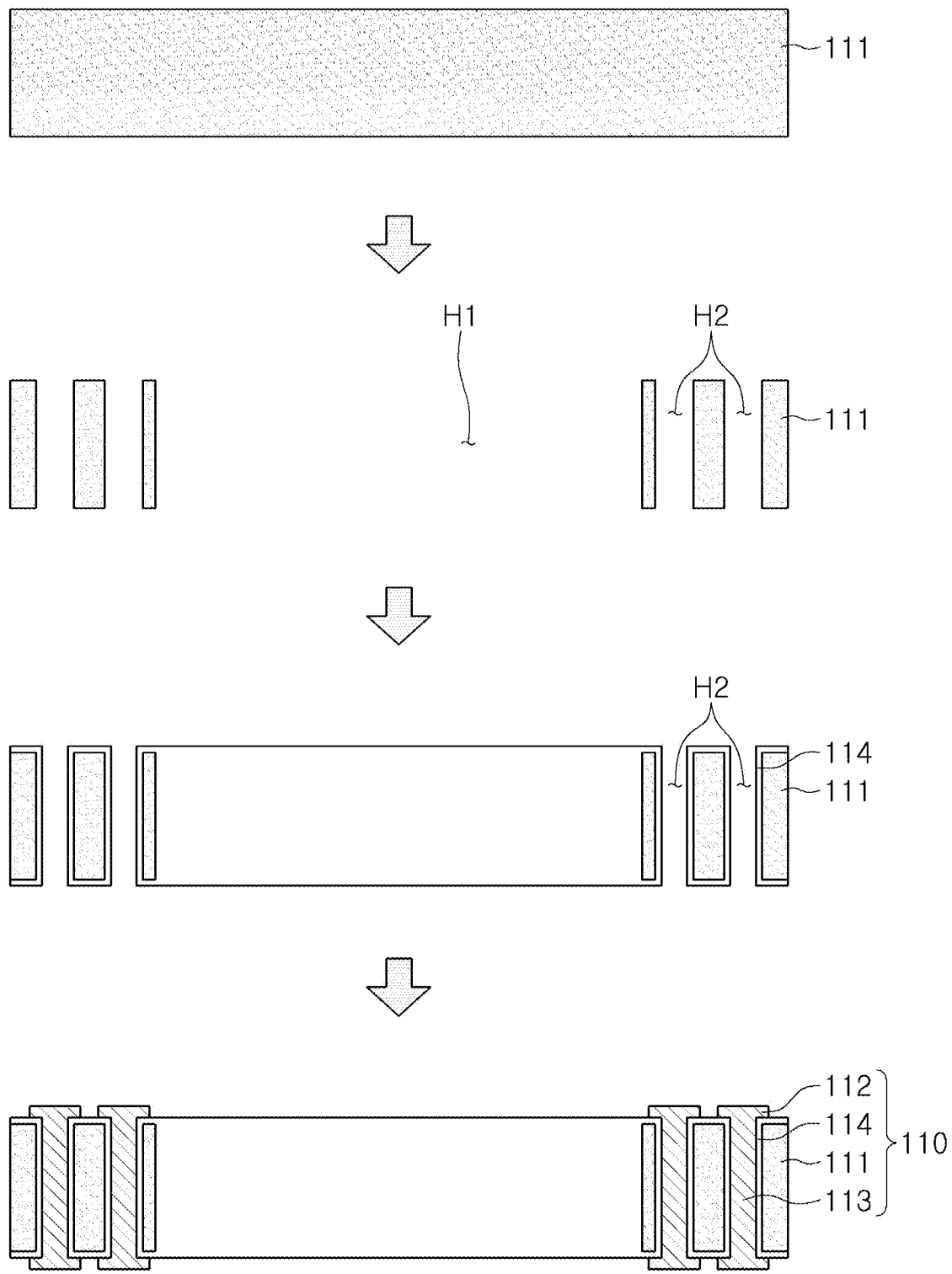
FIGS. 11A to 11D are schematic process drawings illustrating a manufacturing example of the semiconductor package of FIG. 9.

Referring to FIG. 11A, first, a core layer 111 formed of a ferromagnetic material is prepared. The core layer 111 may be a ferromagnetic material layer, for example, a cold rolled steel sheet. Then, a first hole H1 and a second hole H2 are formed in the core layer iii. The first hole H1 and the second hole H2 are formed to pass through both sides of the core layer 111, and may be formed using, for example, laser drilling, or the like. In this case, the first hole H1 and the second hole H2 may have a cylindrical shape having a substantially constant width, rather than a tapered shape. The first hole H1 may include a region in which the semiconductor chip 120 is mounted subsequently, while the second hole H2 may be a region in which the connection via 113 is formed. Then, a core insulating layer 114 is stacked on the core layer 111, and an insulating material is removed from a region corresponding to the second hole H2. The core insulating layer 114 is formed to cover an upper surface, a lower surface, and a side wall of the core layer 111, and may be formed using a method such as lamination, application, deposition, or the like. Then, a connection via 113, in which the second hole H2 is embedded using a conductive material, and wiring layers 112 on both sides of the core layer 111 are formed to complete the frame 110. The connection via 113 and the wiring layer 112 may be formed using a plating process.

Figure 11B:
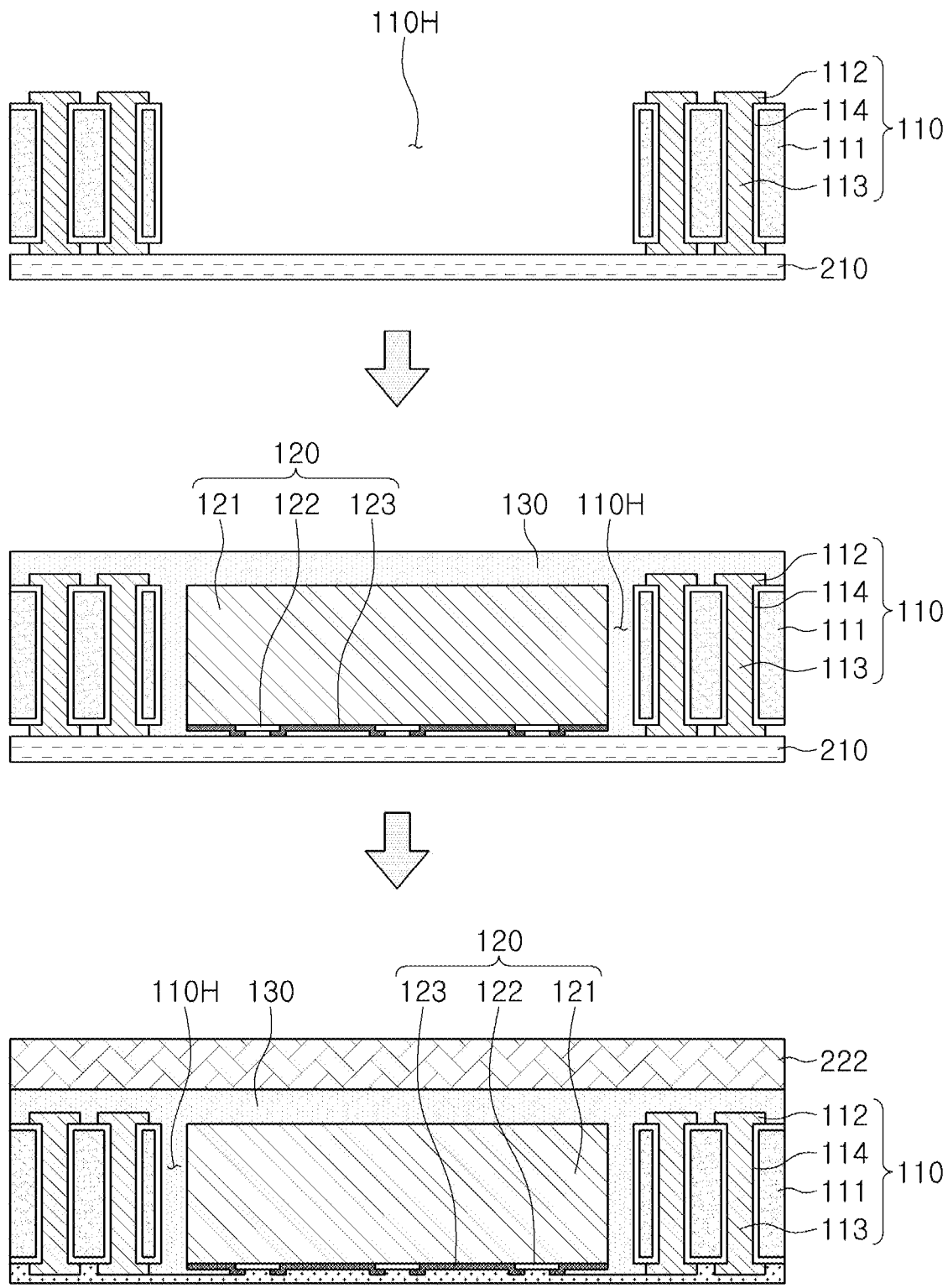

Referring to FIG. 11B, a through-hole 110H, passing through an upper surface and a lower surface of the frame 110, is formed, and an adhesive film 210 is attached to one side of the frame 110. Then, a semiconductor chip 120 is disposed in the through-hole 110H, and a semiconductor chip 120 is sealed using the encapsulant 130. Then, a first magnetic plate 222 such as a magnet is attached to an upper surface of the encapsulant 130 using magnetic force, and the adhesive film 210 is removed from an opposite side. The first magnetic plate 222 may be, for example, permanent magnet or electromagnet. When the first magnetic plate 222 is the electromagnet, the magnetic force may be easily adjusted. Thus, the first magnetic plate 222 is easily attached to or detached from the package.

Figure 11C:
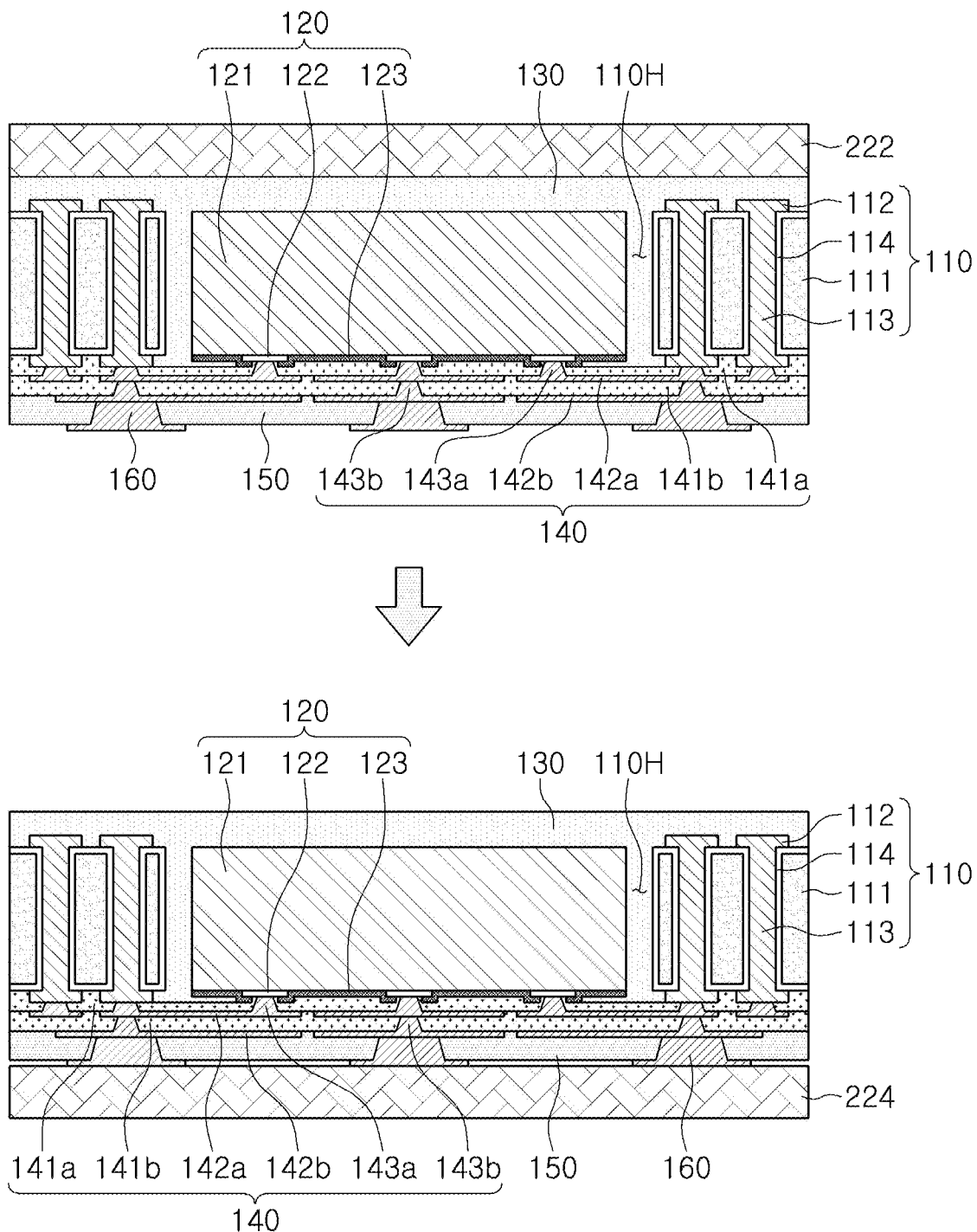

Referring to FIG. 11C, a first connection structure 140 is formed in a lower portion of the semiconductor chip 120, a first passivation layer 150, covering the first connection structure 140, is formed, an opening exposing at least a portion of the second redistribution layer 142b is formed in the first passivation layer 150, and an underbump metal layer 160 is formed in the opening. The first magnetic plate 222 may control warpage, during formation of the first connection structure 140. In other words, the package being manufactured is attached and fixed to the first magnetic plate 222, so relatively warpage may be mitigated. Thus, the first and second redistribution layers 142a and 142b of the first connection structure 140 may be formed with high accuracy. Then, the first magnetic plate 222 is removed, and a second magnetic plate 224 is attached to an opposite side, that is, lower portions of the first passivation layer 150 and the underbump metal layer 160. A first connection structure 140 is interposed between the second magnetic plate 224 and the frame 110, but the entirety of the package being manufactured may be attached to the second magnetic plate 224 by magnetic force due to ferromagnetic properties of the core layer 111.

Figure 11D:
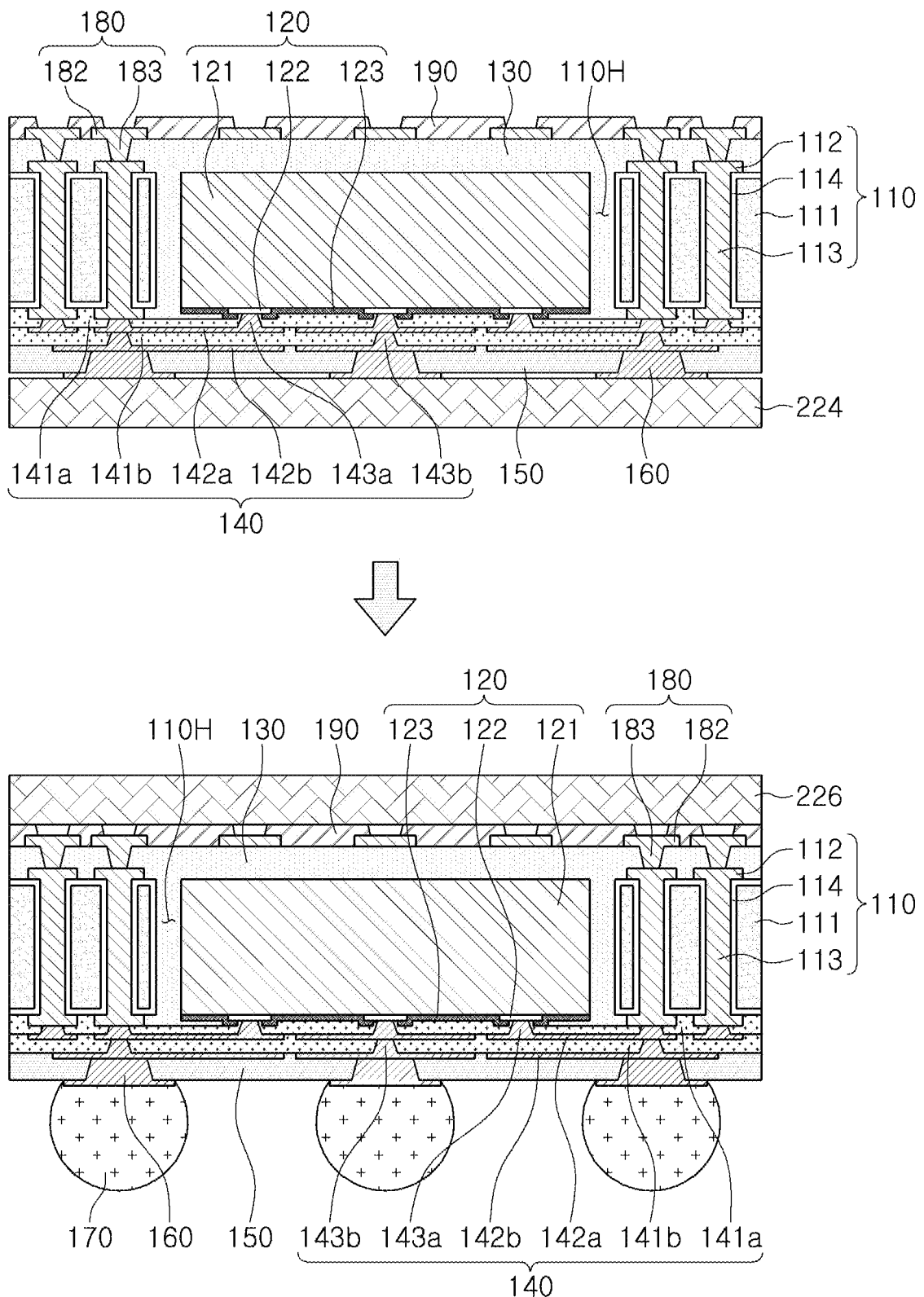

Referring to FIG. 11D, after a via hole passing through the encapsulant 130 is formed in an upper portion of the encapsulant 130, a plating process is performed to form a second connection structure 180, including a backside via 183 and a backside redistribution layer 182, and a second passivation layer 190 is formed. Then, the second magnetic plate 224 is removed, and a third magnetic plate 226 is attached to an opposite side, that is, the second passivation layer 190. Then, an electrical connection metal 170 is formed on the underbump metal layer 160. A second connection structure 180 is interposed between the third magnetic plate 226 and the frame 110, but the entirety of the package being manufactured may be attached to the third magnetic plate 226 by magnetic force due to ferromagnetic properties of the core layer 111. In some cases, the electrical connection metal 170 is also formed up to the underbump metal layer 160 without forming the electrical connection metal 170, and thereafter, a customer company may form an electrical connection metal by a separate subsequent process, if necessary.

Meanwhile, a series of processes may include manufacturing a large-sized frame 110 at a panel level to facilitate mass production, manufacturing a plurality of packages 100A by the abovementioned processes, and then performing a process of singulation for individual packages 100A by a sawing process.

Figure 12:
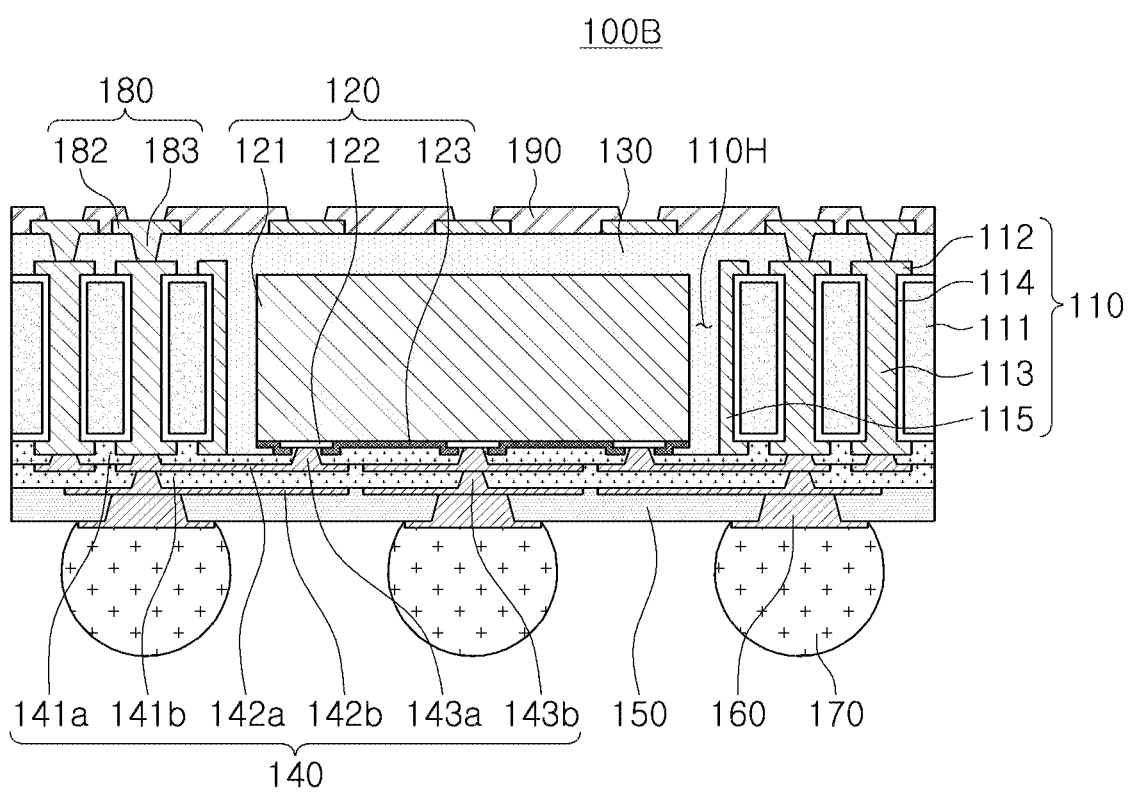
FIG. 12 is a schematic cross-sectional view illustrating another example of a semiconductor package.

FIG. 12 is a schematic cross-sectional view illustrating another example of a semiconductor package.

Referring to FIG. 12, in a semiconductor package 100B according another embodiment, a frame 110 further includes a metal layer 115. The metal layer 115 may be disposed on the core insulating layer 114 in an inner side wall of the through-hole 110H, and may be extended to an upper surface and a lower surface of the core layer 111. The metal layer 115 may be disposed to surround the semiconductor chip 120, and may be connected to a wiring layer 112 in at least a region. The metal layer 115 may be used as a ground. In this case, the metal layer may be electrically connected to a ground of the first and second redistribution layers 142a and 142b of the first connection structure. The metal layer 115 may be introduced to improve an electromagnetic interference (EMI) shielding effect and a heat dissipation effect of the semiconductor chip 120. The metal layer 115 may include a conductive material such as copper (Cu), aluminum (Al), silver (Ag), tin (Sn), gold (Au), nickel (Ni), lead (Pb), titanium (Ti), or alloys thereof. Other configurations are substantially the same as those described in the above-described semiconductor package 100A and the like, and a detailed description thereof will be omitted.

Figure 13:
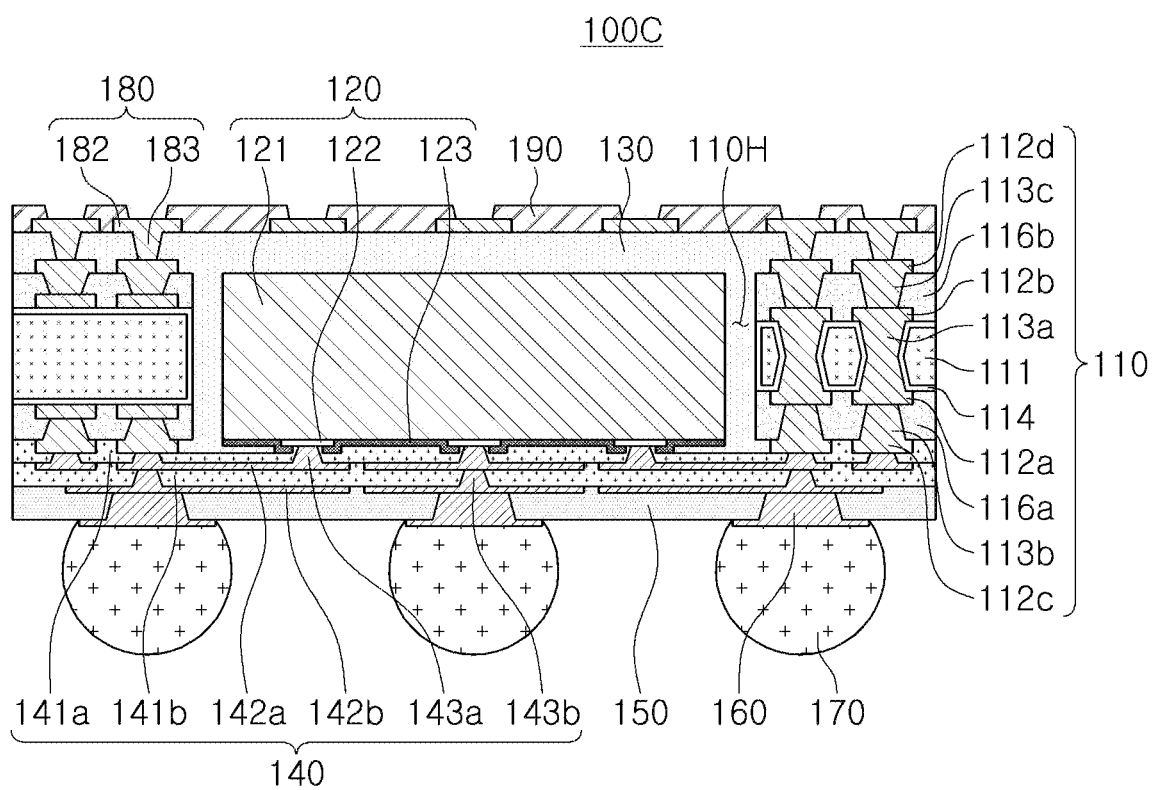
FIG. 13 is a schematic cross-sectional view illustrating another example of a semiconductor package.

FIG. 13 is a schematic cross-sectional view illustrating another example of a semiconductor package.

Referring to FIG. 13, in a semiconductor package 100C according to another embodiment, a frame 110 may include a core layer 111, a core insulating layer 114 surrounding at least a portion of a surface of the core layer 111, a first wiring layer 112a and a second wiring layer 112b disposed on the core insulating layer 114 in both sides of the core layer 111, a first build-up layer 116a and a second build-up layer 116b disposed on both sides of the core layer 111, respectively, and partially covering the first and second wiring layers 112a and 112b, respectively, a third wiring layer 112c disposed on a side of the first build-up layer 116a, opposite to a side in which the first wiring layer 112a is embedded, a fourth wiring layer 112d disposed on a side of the second build-up layer 116b, opposite to a side in which the second wiring layer 112b is embedded, a first connection via 113a passing through the core layer 111 and electrically connecting the first and second wiring layers 112a and 112b, a second connection via 113b passing through the first build-up layer 116a and electrically connecting the first and third wiring layers 112a and 112c, and a third connection via 113c passing through the second build-up layer 116b and electrically connecting the second and fourth wiring layers 112b and 112d. Since the frame 110 may include a further large number of wiring layers 112a, 112b, 112c, and 112d, a first connection structure 140 may be further simplified.

The core layer 111 may have a thickness, greater than thicknesses of the first build-up layer 116a and the second build-up layer 116b. The core layer 111 may be basically relatively thick in order to maintain rigidity and magnetic properties, and the first build-up layer 116a and the second build-up layer 116b may be introduced in order to form a larger number of wiring layers 112c and 112d. The core layer 111 may be formed of a ferromagnetic material, as described above, and the first build-up layer 116a and the second build-up layer 116b may be formed of an insulating material, for example, an ABF or a PID film including a filler and an insulating resin, but an embodiment is not limited thereto.

Other configurations are substantially the same as those described in the above-described semiconductor package 100A and the like, and a detailed description thereof will be omitted.

Figure 14:
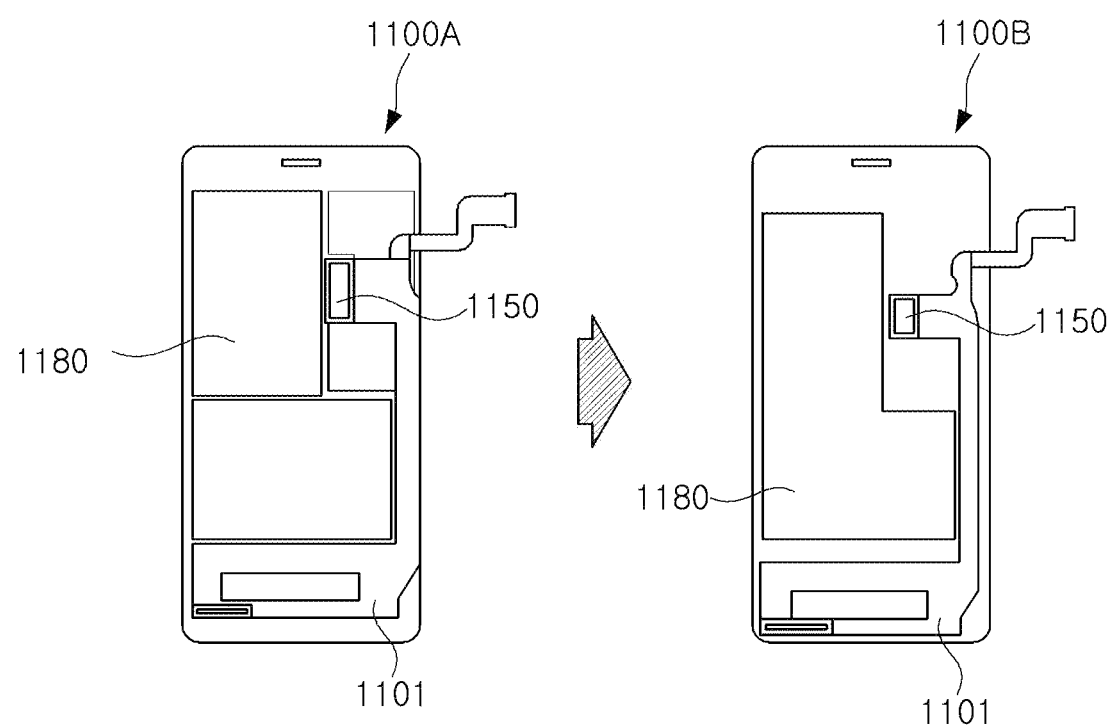
FIG. 14 is a schematic plan view illustrating an effect in a case in which the semiconductor package according to the disclosure is applied to an electronic device.

FIG. 14 is a schematic plan view illustrating an effect in a case in which the semiconductor package according to the disclosure is applied to an electronic device.

Referring to FIG. 14, recently, as a size of display for mobile devices 1100A and 1100B increases, the necessity of increasing battery capacity is increasing. Here, due to an increase in the battery capacity, an area occupied by the battery 1180 is increased. To this end, a reduction in a size of the printed circuit board 1101 such as a mainboard is required. Thus, due to a reduction in a mounting area of a component, an area occupied by a module 1150 including a power management integrated circuit (PMIC) and passive components is gradually decreased. In this case, when the semiconductor packages 100A, 100B, and 100C according to an embodiment are applied to the module 1150, a size is able to be reduced. Thus, the area, which becomes smaller as described, above may be effectively used.

As set forth above, according to an embodiment in the present disclosure, a semiconductor package which can be physically fixed to a magnetic plate to be easily manufactured may be provided.

While exemplary embodiments have been shown and described above, it will be apparent to those skilled in the art that modifications and variations could be made without departing from the scope of the present invention as defined by the appended claims.

What is claimed is:

1. A semiconductor package, comprising:
   a frame including:
   a core layer formed of a ferromagnetic material;
   a through-hole passing through the core layer;
   a semiconductor chip disposed in the through-hole of the frame, and having an active surface on which a connection pad is disposed and an inactive surface opposite to the active surface
   a first wiring layer disposed on an upper surface of the core layer and a second wiring layer disposed on a lowermost surface of the core layer, a lower surface of the second wiring layer being lower than the lowermost surface of the core layer; and
   a connection via passing through the core layer and disposed between the first wiring layer and the second wiring layer; and
   a core insulating layer covering at least a portion of a surface of the core layer, the core insulating layer being provided directly between the lowermost surface of the core layer and an upper surface of the second wiring layer;

an encapsulant covering at least a portion of the semiconductor chip; and a first connection structure disposed on the active surface of the semiconductor chip, and including a first redistribution layer electrically connected to the connection pad.

2. The semiconductor package of claim 1, wherein the frame further includes:

the first wiring layer and the second wiring layer being electrically connected to the connection pad; and the connection via having a side surface surrounded by the core insulating layer.

3. The semiconductor package of claim 1, wherein the first wiring layer and the second wiring layer are respectively spaced apart from the core layer by the core insulating layer.

4. The semiconductor package of claim 1, wherein the connection via has a cylindrical shape with a constant width.

5. The semiconductor package of claim 1, further comprising:

a second connection structure including a via passing through the encapsulant and connected to the first wiring layer of the frame and a second redistribution layer disposed on the via.

6. The semiconductor package of claim 1, wherein the ferromagnetic material includes a ferromagnetic metal material.

7. The semiconductor package of claim 1, wherein the ferromagnetic material includes at least one selected from a group consisting of iron (Fe), nickel (Ni), cobalt (Co), and alloys thereof.

8. The semiconductor package of claim 1, wherein the ferromagnetic material is uniformly distributed in the core layer.

9. A semiconductor package, comprising:

a frame including a core layer formed of a ferromagnetic material, and a through-hole passing through the core layer;

a semiconductor chip disposed in the through-hole of the frame, and having an active surface on which a connection pad is disposed and an inactive surface opposite to the active surface;

an encapsulant covering at least a portion of the semiconductor chip; and a first connection structure disposed on the active surface of the semiconductor chip, and including a first redistribution layer electrically connected to the connection pad, wherein the frame further includes a first wiring layer and a second wiring layer disposed on both sides of the core layer, respectively, first and second build-up layers disposed on both sides of the core layer, respectively, and covering at least portions the first and second wiring layers, respectively, a third wiring layer disposed on the first build-up layer, and a fourth wiring layer disposed on the second build-up layer, and the first to fourth wiring layers are electrically connected to the connection pad.

10. The semiconductor package of claim 9, wherein the frame further includes a core insulating layer disposed between the core layer and each of the first and second build-up layers.

11. The semiconductor package of claim 10, wherein the core insulating layer is interposed between the core layer and each of the first and second wiring layers.

12. A semiconductor package, comprising:

a frame having a through-hole and a core layer formed of a ferromagnetic material wherein the core layer surrounds the through-hole;

a semiconductor chip disposed in the through-hole of the frame, and having an active surface on which a connection pad is disposed and an inactive surface opposite to the active surface;

an encapsulant covering at least a portion of the semiconductor chip; and a connection structure disposed on the active surface of the semiconductor chip, and including a redistribution layer electrically connected to the connection pad, wherein the frame has magnetic properties due to the core layer, wherein the frame further includes a core insulating layer covering at least a portion of a surface of the core layer, wherein the core insulating layer includes prepreg or an Ajinomoto Build-up Film (ABF).

13. The semiconductor package of claim 12, wherein the frame further includes a connection via passing through the core layer and spaced apart from the core layer by the core insulating layer.

14. The semiconductor package of claim 1, wherein the core insulating layer covers a side surface of the core layer except for an outmost side surface forming a side surface of the semiconductor package, the upper surface of the core layer, and the lowermost surface of the core layer.

15. The semiconductor package of claim 1, wherein the core insulating layer is disposed between the upper surface of the core layer and a lower surface of the first wiring layer.

16. The semiconductor package of claim 9, wherein the core layer has a thickness greater than thicknesses of the first and the second build-up layers.

* * * * *